(12) United States Patent
Sakurai

(10) Patent No.: US 6,340,889 B1
(45) Date of Patent: Jan. 22, 2002

(54) BATTERY STATE MONITORING CIRCUIT AND BATTERY APPARATUS

(75) Inventor: Atsushi Sakurai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/546,196

(22) Filed: Apr. 10, 2000

(30) Foreign Application Priority Data

Apr. 8, 1999 (JP) .............................. 11-101668

(51) Int. Cl.[7] .............................................. G01N 27/416
(52) U.S. Cl. ...................................... 324/433; 320/134
(58) Field of Search .................................. 320/116, 117, 320/118, 119, 120, 121, 122; 324/433

(56) References Cited

U.S. PATENT DOCUMENTS 5,982,114 A * 11/1999 Johnson et al. .............. 320/122
6,104,164 A * 8/2000 Iino et al. ..................... 320/116
6,121,752 A * 9/2000 Kitahara et al. ............. 320/122

FOREIGN PATENT DOCUMENTS

DE 19708842 A1 * 9/1998
EP 1041694 A2 * 10/2000
JP 05-135792 A * 6/1993
JP 11-262188 A * 9/1999

OTHER PUBLICATIONS

IBM Technical Disclosure Bulletin, "Failed Detector for Series Cell Batteries", Oct. 1981, vol. 24, issue 5, pp. 2248–2249.*

* cited by examiner

Primary Examiner—Gregory J. Toatley, Jr.
(74) Attorney, Agent, or Firm—Adams & Wilks

(57) ABSTRACT

The present invention provides a battery state monitoring circuit having a divided battery voltage monitor circuit, and a battery apparatus employing the same. The configuration is adopted in which a divided battery voltage monitor circuit is provided in order to be able to output the divided voltage value of the total voltage of a plurality of secondary batteries. As a result, the number of switches for use in a change-over switch circuit is decreased and a differential amplifier circuit having the high withstanding voltage becomes unnecessary. Thus, it is possible to monitor the battery voltages of the secondary batteries with a simple circuit.

12 Claims, 7 Drawing Sheets

BATTERY STATE MONITORING CIRCUIT AND BATTERY APPARATUS

BACKGROUND OF THE INVENTION

1. Field of the Invention

The present invention relates to a battery apparatus and a battery state monitoring circuit each of which is capable of calculating the remaining power of secondary batteries such as the lithium ion secondary batteries.

2. Description of the Related Art

As for a conventional battery state monitoring circuit, there is known the apparatus the circuit diagram of which is shown in FIG. 2. For example, such a configuration is disclosed in Japanese Patent Application Laid-Open No. Hei 09-312172 entitled "BATTERY PACK, BATTERY CHARGER, CHARGING SYSTEM AND CHARGING METHOD". This official gazette disclosure relates to a battery apparatus called the Smart Battery System.

Each of the lithium ion secondary batteries for use in the Smart Battery System does not have a self-protection function as in the Ni-Cd battery and hence a circuit for over-charge protection is required therefor. For this reason, a battery voltage monitor circuit 4A for detecting the battery voltage and a switch device 12A for stopping charging of the battery from the outside are both provided therein.

A battery apparatus 22A receives, at a microcomputer 6A serving as information processing means, signals A3A and A4A which have been respectively output by a current monitor circuit 3A and a battery voltage monitor circuit 4A to monitor the battery voltages, the charging current and the discharging current of secondary batteries 7A, 8A, 9A and 10A. Then, the microcomputer 6A, using that information (the battery voltages, the charging current and the discharging current), calculates the remaining power of the secondary batteries 7A, 8A, 9A and 10A, and also controls the ON/OFF state of switching devices 12A and 13A used as current limiting means to control the charge and the discharge to and from the secondary batteries 7A, 8A, 9A and 10A.

The battery apparatus 22A configured in such a manner carries out the display of remaining power and stops charging of the secondary batteries 7A, 8A, 9A and 10A by the microcomputer 6A. The output voltages A3A and A4A are respectively input from a current monitor circuit 3A and a battery voltage monitor circuit 4A to the microcomputer 6A which can calculate the charging current, the discharging current and the battery voltages of the secondary batteries 7A, 8A, 9A and 10A on the basis of the voltages A3A and A4A thus input thereto to calculate the remaining power of the secondary batteries. In addition, since the microcomputer 6A carries out the ON/OFF control of the switching devices 12A and 13A on the basis of the state of the secondary batteries (in general, the over-charge, the over-discharge and the over-current states), the microcomputer 6A takes on itself the safety for the protection function (the over-charge protection, the over-discharge protection and the over-current protection) in the battery apparatus 22A.

The battery voltage monitor circuit 4A converts the respective voltages of the secondary batteries 7A, 8A, 9A and 10A into voltages which can be read by the microcomputer 6A to output the resultant voltages. For example, an example of a configuration of the conventional voltage monitor circuit 4A is shown in FIG. 6. The battery voltage monitor circuit 4A is a circuit including a change-over switch 33A, a battery voltage monitor amplifier 34A and the like. The change-over switch 33A selects the battery voltage of a respective one of the secondary batteries 7A, 8A, 9A and 10A one after the other, and the battery voltage monitor amplifier 34A converts the battery voltage thus selected into a voltage which is can be read by the microcomputer 6A to output as a voltage A4A to one signal line. Thus, which secondary battery is selected is determined on the basis of a control signal B4A which is controlled by the microcomputer 6A so that the voltages of the secondary batteries are successively output to the one signal line. In this connection, while as for the control signal B4A, only one line is illustrated in FIG. 6, it is also conceivable as the assembly of a plurality of signals. In addition, the diagram of the switches in the change-over switch circuit 33A shown in FIG. 6 is a schematic expression, and hence any switch configuration may be available for use as long as it can output the battery voltages one after the other.

However, since in the conventional battery voltage monitor circuit 4A as shown in FIG. 6, the battery voltages on the respective output lines of the secondary batteries 7A, 8A, 9A and 10A are successively output to the microcomputer 6A one after the other, the following performance is required.

First of all, a large number of switches are required for the change-over switch circuit 33A and hence a large number of signal patterns based on which of those switches are controlled are required. In addition, when the secondary batteries 7A, 8A, 9A and 10A are connected in series, the battery voltage monitor amplifier 34A, for the reason of outputting the respective voltage values, must be a differential amplifier, and needs to have a withstanding voltage which is equal to or higher than the total voltage of the secondary batteries 7A, 8A, 9A and 10A at the lowest, and also can output or cancel the offset voltage which has been generated depending on the input voltage level.

As described above, there arises the problem that since the conventional battery voltage monitor circuit has many performance requirements, the configuration of the circuit becomes complicated, and also since a high withstanding voltage processing is also required therefor, the circuit area is increased and hence the manufacturing cost of the circuit becomes high.

SUMMARY OF THE INVENTION

In the light of the foregoing, the present invention has been made in order to solve the above-mentioned problems associated with the prior art, and it is therefore an object of the present invention to configure the battery voltage monitor circuit with a simple circuit configuration and also to monitor the battery voltages with simple method to inexpensively provide a battery state monitoring circuit and a battery pack.

In order to attain the above-mentioned object, according to an aspect of the present invention, instead of the conventional battery voltage monitor circuit, there is provided a divided battery voltage monitor circuit which is capable of dividing the total voltage of a plurality of secondary batteries connected in series and the voltage of each of the connections into respective arbitrary voltage values to output the resultant voltage values. The divided battery voltage monitor circuit is realized with a simple circuit configuration and is miniaturized. In addition, there is also adopted a battery voltage monitoring method of calculating the battery voltages on the basis of the combination of the divided battery voltage values using a microcomputer as one constituent element of the battery state monitoring circuit.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE PREFERRED EMBODIMENTS

The preferred embodiments of the present invention will hereinafter be described in detail with reference to the accompanying drawings.

Figure 1:
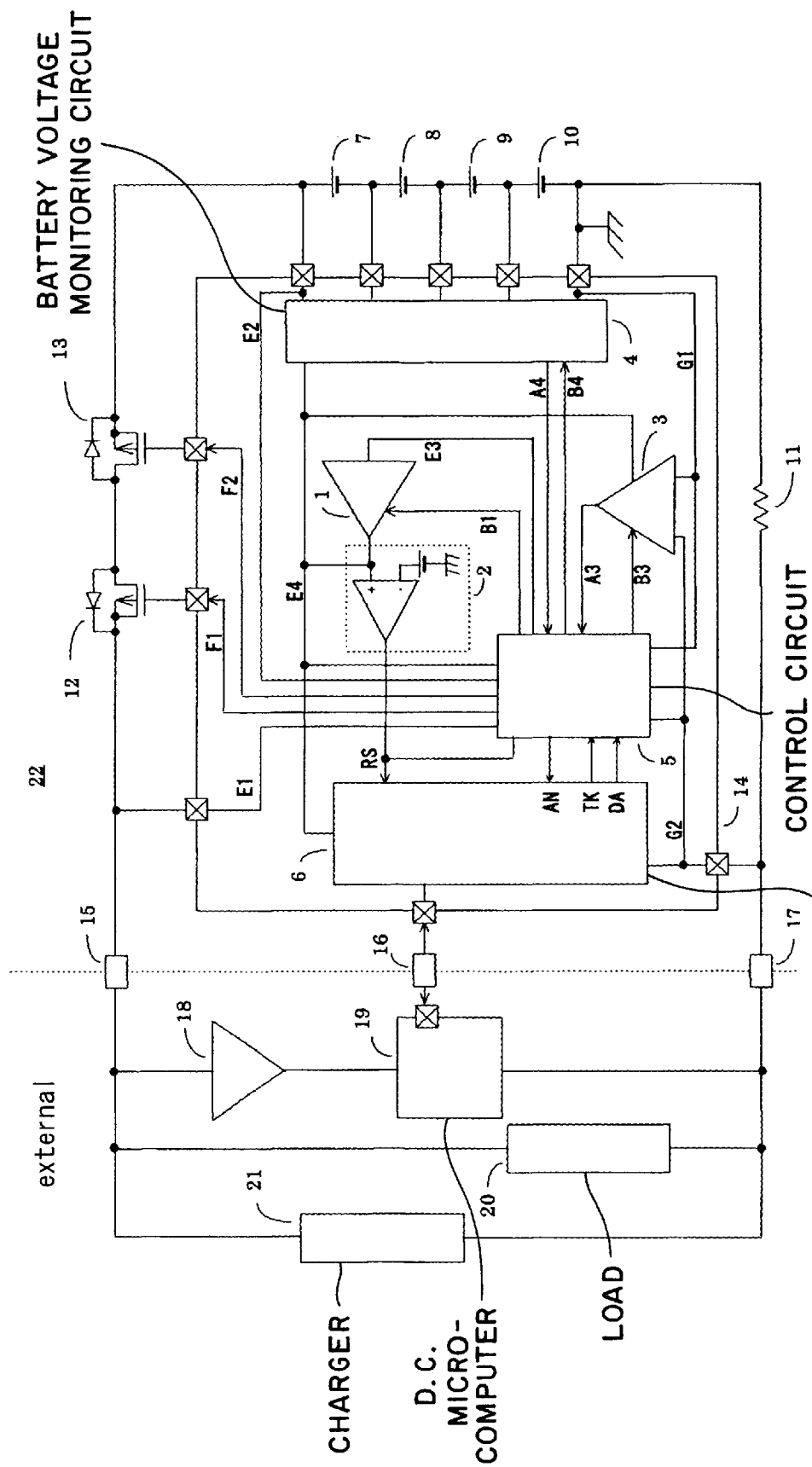
FIG. 1 is a block diagram, partly in circuit diagram, showing a configuration of an embodiment of a battery state monitoring circuit and a battery apparatus employing the same according to the present invention.
Figure 2:
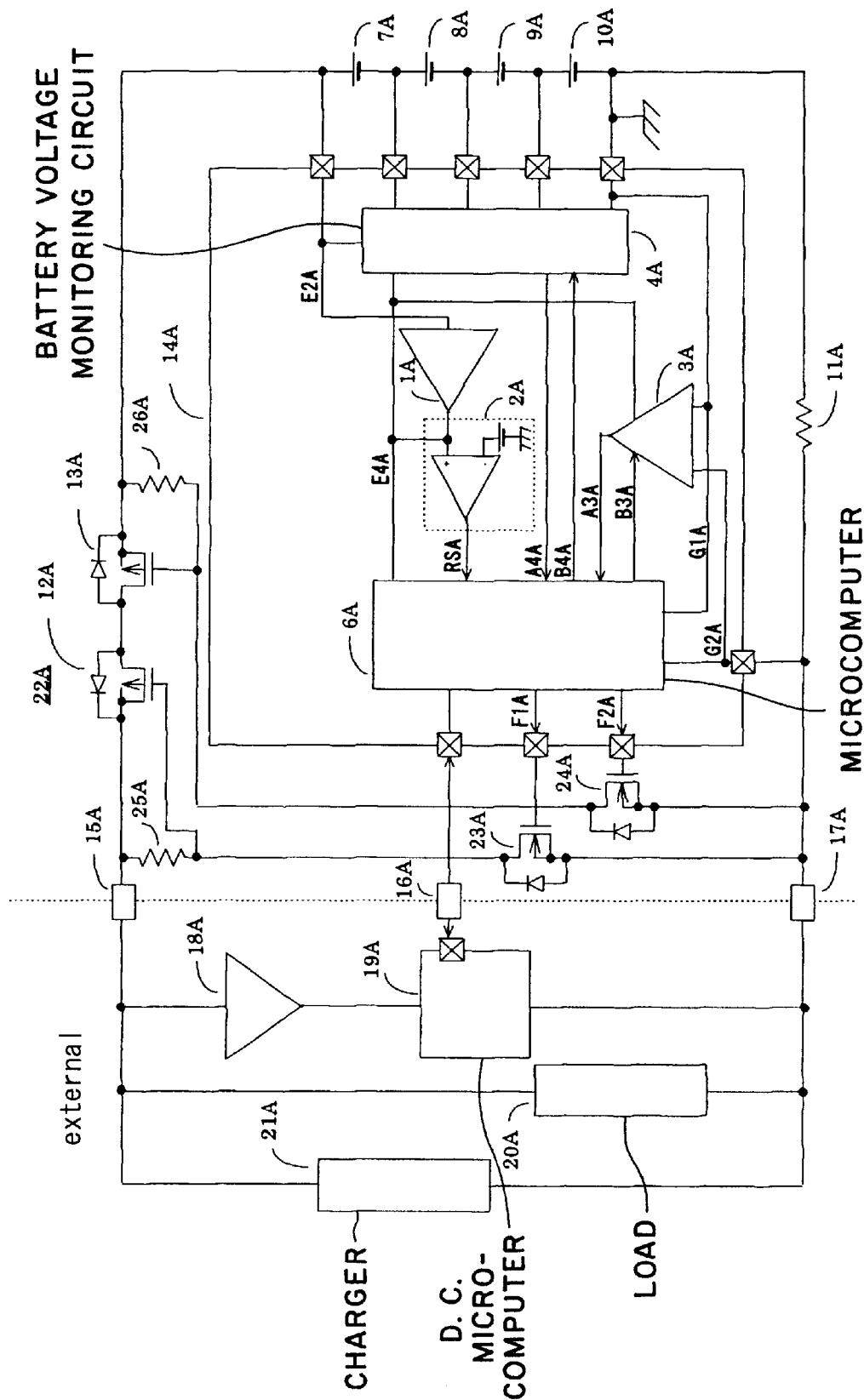
FIG. 2 is a block diagram, partly in circuit diagram, showing a configuration of a conventional battery state monitoring circuit and a battery apparatus employing the same.

FIG. 1 is a block diagram, partly in circuit diagram, showing a configuration of an embodiment of a battery state monitoring circuit and a battery apparatus employing the same according to the present invention. The present embodiment of the invention will hereinbelow be described in detail with reference to FIG. 1.

By the battery apparatus is meant the apparatus wherein a battery state monitoring circuit and switch devices for controlling the charge/discharge of one or a plurality of secondary batteries (e.g., lithium ion secondary batteries) which are connected in series or in parallel with one another. In the example shown in FIG. 1, four secondary batteries 7, 8, 9 and 10 are connected in series with one another, and the negative pole of the secondary battery 10 is connected to a sense resistor 11. In addition, the sense resistor 11 is connected to a negative terminal 17 of a battery apparatus 22. Also, the positive pole of the secondary battery 7 is connected to a switch device 13 which is comprised of an FET (Field Effect Transistor) or the like.

A switch device 12 and the switch device 13 are connected in series with one another, and also the switch device 12 is connected in series to a positive terminal 15 of the battery apparatus 22. Both of the switch devices 12 and 13 are used to control the charge of the secondary batteries 7 to 10 from a battery charger 21 and the discharge of the secondary batteries 7, 8, 9 and 10. When intending to inhibit the charge of each of the secondary batteries 7, 8, 9 and 10, the switch device 12 may be turned OFF. On the other hand, when intending to inhibit the discharge of each of the secondary batteries 7, 8, 9 and 10, the switch device 13 may be turned OFF. Both of the switch devices 12 and 13 may instead be connected between the negative pole of the secondary battery 10 and the sense resistor 11. In such case, the kind (N-channel or P-channel) of switch device (e.g., the FET) would need to be suitably changed in correspondence to the circuit configuration. Likewise, the sense resistor 11 may also be connected on the positive terminal 15 side of the battery apparatus 22.

A battery state monitoring circuit 14 includes a regulator 1, a voltage detecting circuit 2, a current monitor circuit 3, a microcomputer 6 and the like.

The regulator 1 acts in such a way that even if an input voltage E3 fluctuates, an output voltage E4 becomes constant (e.g., 3.3 V or 5 V) at all times. In addition, the ON/OFF state of the output of the regulator 1 can be controlled on the basis of a control signal B1.

The voltage detecting circuit 2 is connected to the output of the regulator 1. The voltage detecting circuit 2, for example, as surrounded by a rectangular dotted line of FIG. 1, includes a comparator and the reference voltage, and at the time when the voltage input thereto has reached a certain set value, its output voltage is changed. In FIG. 1, at the time when the output voltage E4 of the regulator 1 has become equal to or lower than a certain set voltage (a reset detection voltage), an output RS of the voltage detecting circuit 2 is changed from High to Low. Upon occurrence of this output change, the operation of the microcomputer 6 is stopped, whereby it is possible to prevent the microcomputer 6 from undergoing a malfunction. In general, such a control method is called "the reset". By the reset detection voltage of the microcomputer is meant the lowest operating voltage at which the microcomputer does not undergo malfunction (the run away), and in general, in the case of the microcomputer having a 5V input, the reset detection voltage is about 4.6 V or so.

The current monitor circuit 3 amplifies the voltage developed across the sense resistor 11 due to the charging and discharging currents flowing therethrough to a voltage which can be read by the microcomputer 6 to send the voltage thus amplified to the control circuit 5. Since in general, the resistance value of the sense resistor 11 is so small as to be several tens of Ωm, the current monitor circuit 3 amplifies the voltage developed across the sense resistor 11 by several tens to several hundreds of times to supply the voltage thus amplified to the control circuit 5.

The control circuit 5 has a function of switching the power source voltage, a function of communicating with the microcomputer and a function of controlling the circuit blocks, a function of switching the analog signal, and a data reset function. By "the function of switching the power source voltage" of the control circuit 5 is meant the function of comparing the voltage E1 of the battery charger and the total battery voltage E2 of the secondary batteries with each other to output the higher voltage of them as E3 which is made in turn the power source voltage of the regulator 1. By "the function of communicating with the microcomputer and the function of controlling the circuit blocks" of the control circuit 5 are meant the function of converting a serial data signal DA output by the microcomputer 6 into control signals B1, B3, B4, F1 and F2 for controlling the respective circuit blocks. In addition, by "the function of switching the analog signal" of the control circuit 5 is meant the function of selecting and processing successively an output signal A3 of the current monitor circuit 3 and an output signal A4 of a plural battery voltage monitor circuit 4 shown in FIG. 1 to send the output signal thus selected and processed in the form of an analog signal AN to the microcomputer 6.

The output analog signal AN is selected from any one of the charging current, the discharging current or the battery voltages on the basis of signals TK and DA from the microcomputer 6. By "the data reset function" of the control circuit 5 is meant the function of turning OFF the switch devices 12 and 13 for controlling the charge and discharge to inhibit the charge and the discharge on the basis of the signal RS which is changed at the time when the output voltage E4 of the regulator 1 has become lower than the reset detection voltage of the microcomputer 6.

By the microcomputer 6 is meant the computer having the function of monitoring the battery voltages, the charging current and the discharge current of the secondary batteries 7, 8, 9 and 10 and the function of calculating the remaining power of the secondary batteries 7, 8, 9 and 10 on the basis of that information. The microcomputer 6 has the A/D conversion and arithmetic function, the communication function and the like, and sends instruction signals TK and DA to the control circuit 5 to select and output successively the analog signals A3 and A4 from the current monitor circuit 3 and the plural battery voltage monitor circuit 4 in the form of the analog signal AN of the control circuit 5. Then, after that analog signal AN has been subjected to A/D conversion in the microcomputer 6 which accumulates in turn the charging current and the discharging current to calculate the remaining power of the secondary batteries by taking the battery voltages into consideration.

In addition, the microcomputer 6 monitors the battery voltages and the discharging current of the secondary batteries 7, 8, 9 and 10 to control ON/OFF of the switch devices 12 and 13 in accordance with the voltage and the discharging current of the secondary batteries, thereby protecting the battery apparatus 22.

Since the microcomputer 6 takes on itself the safety for the protection function (the over-charge protection, the over-discharge protection and the over-current protection) in the battery apparatus 22, if the operation of the microcomputer 6 is stopped or the microcomputer 6 develops trouble so that the protection function becomes inactive, there is the possibility that the battery apparatus 22 may blow up in the worst case. Then, in order to ensure that the battery apparatus 22 may be made safe even if the operation of the microcomputer 6 is stopped or the microcomputer 6 develops trouble, when the power source voltage is so low as to stop the microcomputer 6 or when the power source voltage of the microcomputer 6 rises from the low voltage (for example, when the power source voltage makes a return from the state in which the power source voltage has been lower than the reset detection voltage one time, when the power source voltage of the microcomputer 6 is made to rise from 0 V, or so forth), the voltage detecting circuit 2 causes the switch devices 12 and 13 to be reset to turn OFF the switch devices 12 and 13, and under this state after the battery charger 21 is connected so that the power source voltage E4 of the microcomputer 6 becomes so high as to be equal to or higher than the voltage at which the microcomputer 6 is normally operated, the instruction signal is sent from the microcomputer 6 to the control circuit 5 to turn ON the switch devices 12 and 13, respectively.

In such a manner, since the switch devices 12 and 13 are held turned OFF unless the microcomputer 6 sends the instruction signal of turning ON the switch devices 12 and 13, for example, even if the operation of the microcomputer 6 is stopped or the microcomputer 6 develops trouble so that the microcomputer can not be controlled, neither the charge nor the discharge can be carried out unless the microcomputer sends the instruction signal of turning ON the switch devices 12 and 13. Therefore, even when the operation of the microcomputer 6 is stopped or the microcomputer 6 develops trouble, it is possible to ensure the safety of the battery apparatus 22.

In addition, when the microcomputer 6 makes a return from the reset state, since after the switch devices 12 and 13 are first turned OFF and then the microcomputer 6 is perfectly, stably operated, the switch devices 12 and 13 are both turned ON, unmeasurable charging current and discharging current disappear, and hence the accuracy of calculating the remaining power of the secondary batteries is enhanced.

The microcomputer 6 transmits the signal B4 which is used to select arbitrary plural batteries to the divided battery voltage monitor circuit 4 through the control circuit 5. In response to the signal B4 transmitted thereto, the divided battery voltage monitor circuit 4 divides through the resistors the total voltage value of the arbitrary plural batteries which have been selected to a predetermined voltage value to monitor the resultant predetermined voltage values and then transmits the resultant voltage value in the form of the indirect battery voltage A4 to the microcomputer 6 through the control circuit 5. Then, the microcomputer 6 calculates the battery voltage on the basis of the combination of the indirect battery voltages A4.

Figure 3:
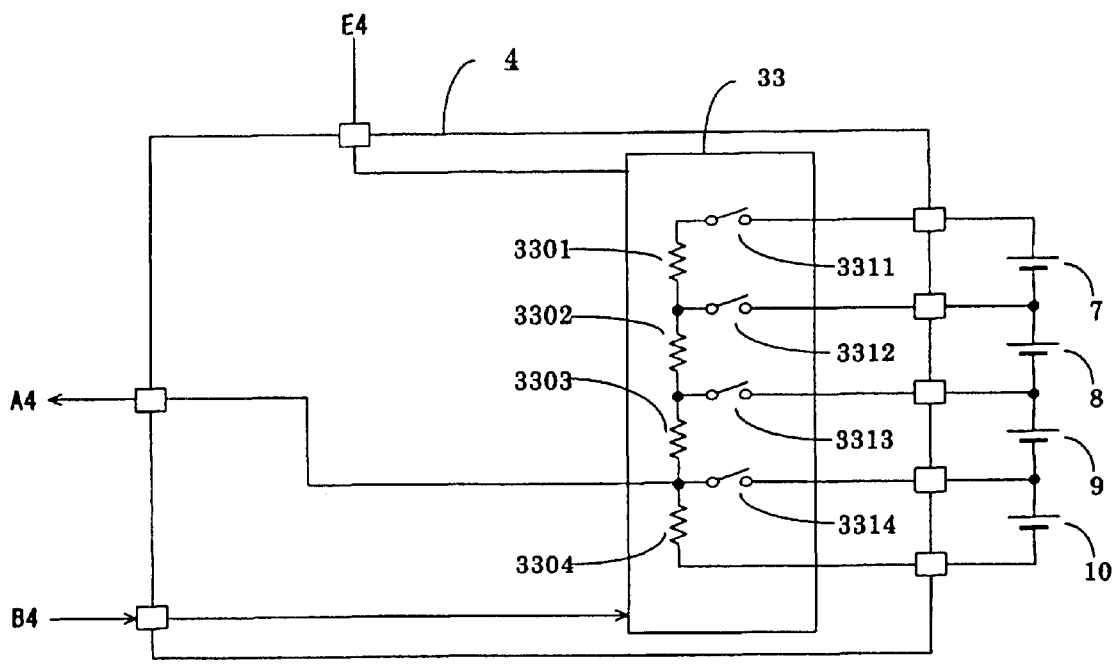
FIG. 3 is a circuit diagram showing a configuration of an embodiment of a divided battery voltage monitor circuit for use in a battery state monitoring circuit and a battery apparatus employing the same of the present invention.

FIG. 3 is a circuit diagram showing a configuration of an embodiment of a divided battery voltage monitor circuit for use in the battery state monitoring circuit and the battery apparatus employing the same according to the present invention.

A divided battery voltage monitor circuit 4 shown in FIG. 3 includes a switch circuit 33 which has in turn division resistors 3301, 3302, 3303 and 3304 connected in series with one another. Then, switches 3311, 3312, 3313 and 3314 are connected in such a way that those division resistors and the secondary batteries 7, 8, 9 and 10 show one-to-one correspondence.

For example, when it is assumed that the voltage values of the secondary batteries 7, 8, 9 and 10 are respectively V1, V2, V3 and V4 and the resistance values of the division resistors 3301, 3302, 3303 and 3304 are respectively R1, R2, R3 and R4, and A4 output voltage VA4 when for example, only the switch 3314 is turned ON is expressed by an expression (1).

$$VA4=V4 \qquad (1)$$

Next, the A4 output voltage VA4 when only the switch 3313 is turned ON is expressed by an expression (2).

$$VA4=R4(V3+V4)/(R3+R4) \qquad (2)$$

Next, the A4 output voltage VA4 when only the switch 3312 is turned ON is expressed by an expression (3).

$$VA4=R4(V2+V3+V4)/(R2+R3+R4) \qquad (3)$$

Next, the A4 output voltage VA4 when only the switch 3311 is turned ON is expressed by an expression (4).

$$VA4=R4(V1+V2+V3+V4)/(R1+R2+R3+R4)+tm \quad (4)$$

Now, since the resistance ratio of R1 to R4 is freely set and hence is known, by substituting the expression (1) for the expression (2), the voltage value of V3 can be calculated. Likewise, by substituting the expression (2) for the expression (3) and then by substituting the expression (3) for the expression (4), the voltage values of V2 and V1 can be respectively calculated.

The calculation of the above-mentioned secondary battery voltages V1 to V4 can be simply carried out in the microcomputer 6 which is incorporated in the battery state monitoring circuit. That is, even if the indirect information of the battery voltages is output as in the present invention, only by changing the calculation processing method of the microcomputer 6, it is possible to be aware of the battery voltages in a similar manner to the prior art without the necessity of adding any of new circuits nor any additional components at all.

Figure 6:
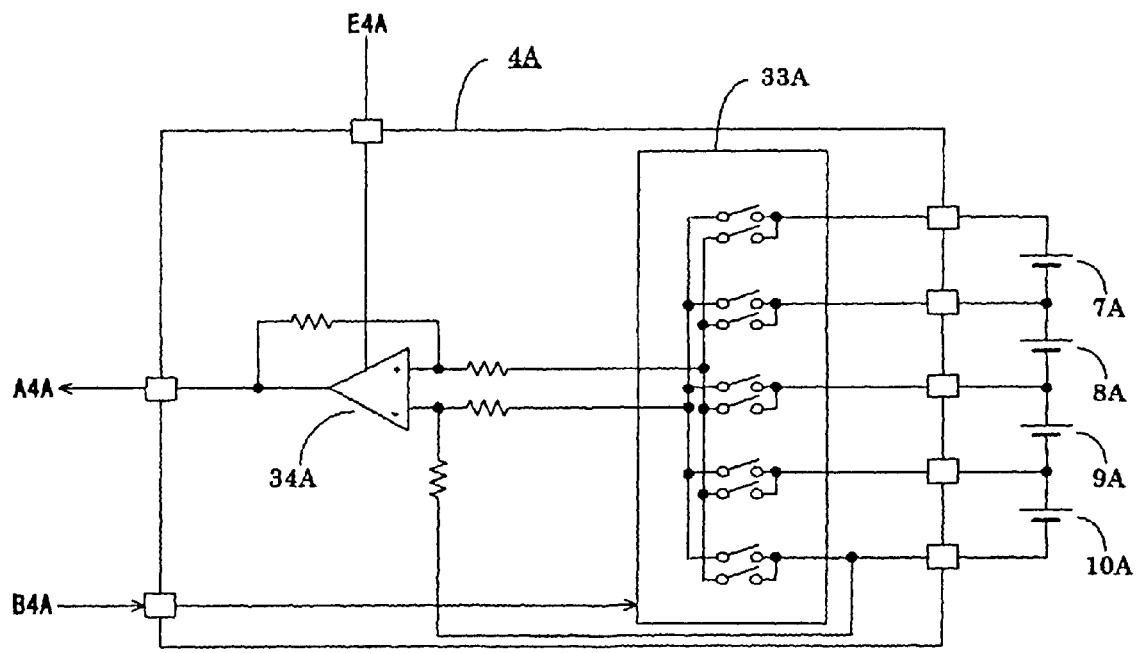
FIG. 6 is a circuit diagram showing a configuration of a battery voltage monitor circuit for use in a conventional battery monitoring circuit and a battery apparatus employing the same.

In addition, comparing the conventional battery voltage monitor circuit 4A shown in FIG. 6 with the divided battery voltage monitor circuit 4 of the present invention shown in FIG. 3, it is understood that the circuit configuration of the divided battery voltage monitor circuit 4 of the present invention is greatly simplified.

First of all, comparing the switch circuit 33 of the present invention with the conventional switch circuit 33A, it is understood that the circuit configuration is simplified and also the number of switches is decreased. This also contributes to the simplification of the control circuit and the signal pattern for controlling the switches.

Next, while the conventional battery voltage monitor amplifier 34A needs to have a performance high enough so that the amplifier 34A must be included, from the reason of outputting the respective voltage values, the differential amplifier, and has a withstanding voltage equal to or higher than the total voltage of the secondary batteries 7A, 8A, 9A and 10A at the lowest, and can output or cancel the offset voltage which is generated depending on the input voltage level, in the present invention, the battery voltage monitor amplifier 34A itself becomes unnecessary. As a result, both the complicated circuit and the high-voltage withstanding fabricating process becomes unnecessary, and hence the manufacturing cost can be reduced.

Figure 4:
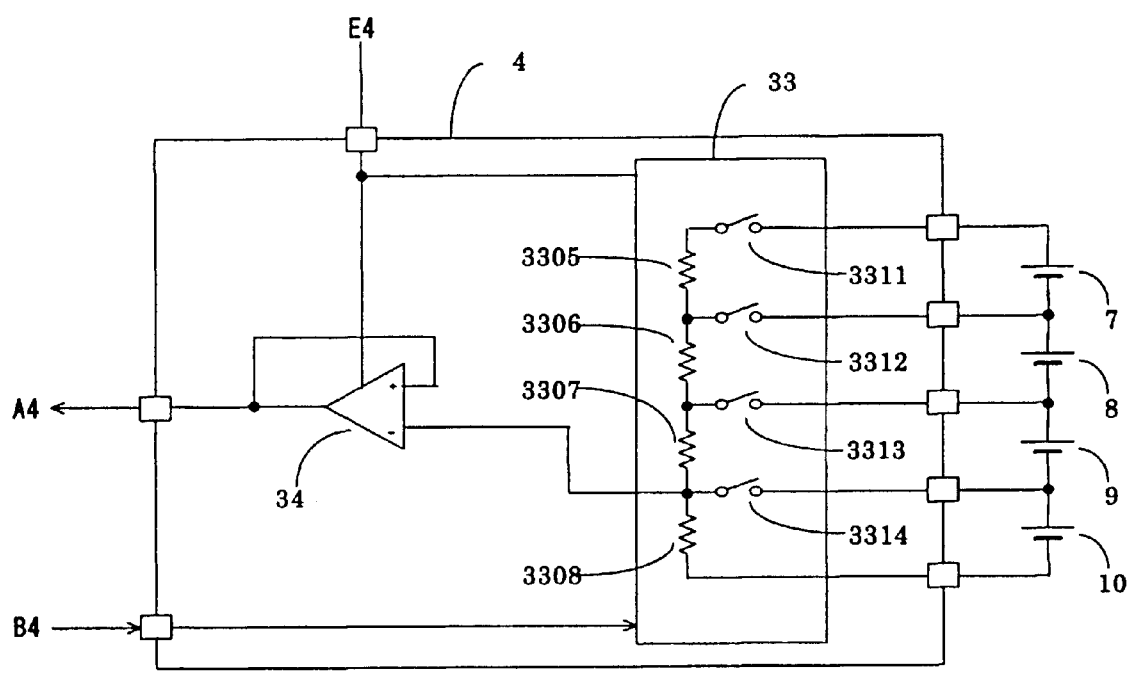
FIG. 4 is a circuit diagram showing a configuration of another embodiment of a divided battery voltage monitor circuit for use in a battery state monitoring circuit and a battery apparatus employing the same of the present invention.

FIG. 4 is a circuit diagram showing a configuration of another embodiment of a divided battery voltage monitor circuit for use in the battery state monitoring circuit and the battery apparatus employing the same of the present invention.

In FIG. 4, the configuration of the divided battery voltage monitor circuit has a voltage follower circuit 34 which is added to the configuration of FIG. 3. This configuration is effective in the case where the output impedance for the signal A4 wants to be decreased. Other effects are similar to those in the circuit shown in FIG. 3. Since the configuration of the voltage follower circuit 34 is simple and also it can be produced using a low voltage withstanding fabrication process if the division resistance ratio of the switch circuit 33 is set suitably, the circuit area can be reduced as compared with the conventional battery voltage monitor amplifier 34A.

Figure 5:
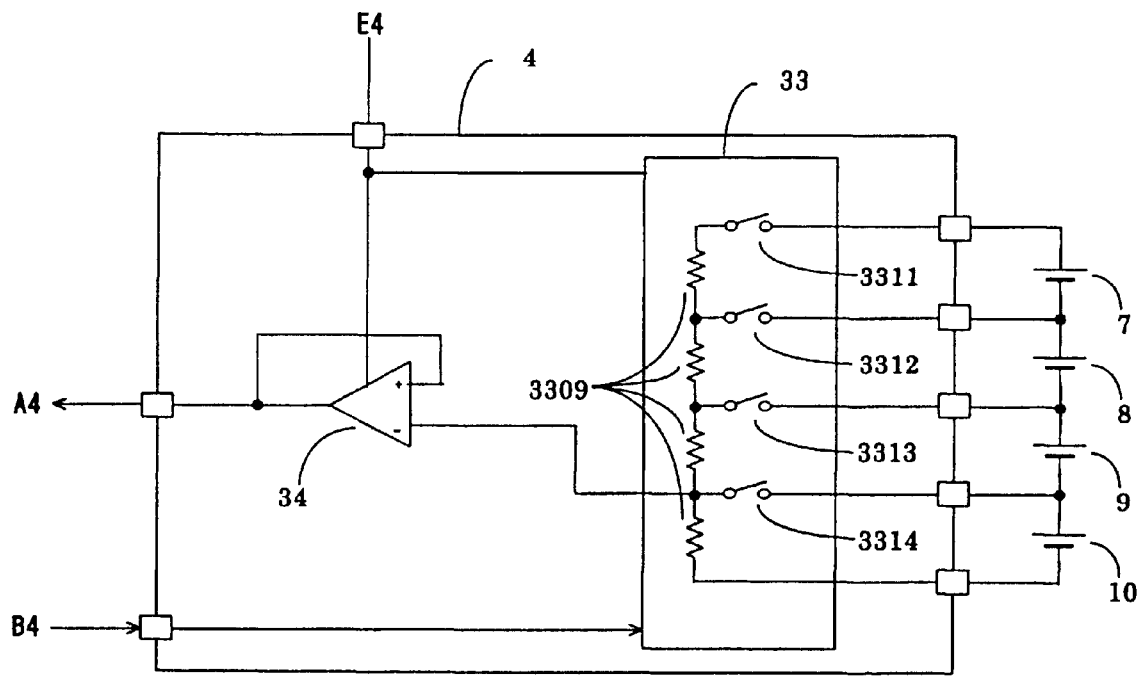
FIG. 5 is a circuit diagram showing a configuration of still another embodiment of a divided battery voltage monitor circuit for use in a battery state monitoring circuit and a battery apparatus employing the same of the present invention.

FIG. 5 is a circuit diagram showing a configuration of still another embodiment of a divided battery voltage monitor circuit for use in the battery state monitoring circuit and the battery apparatus employing the same of the present invention.

In FIG. 5, instead of employing the division resistors 3301, 3302, 3303 and 3304 provided in the switch circuit 33 shown in FIG. 4, a division resistor 3309 having the equal resistance values is used. As a result, the method of calculating the battery voltages can be simplified.

For example, the A4 output voltage VA4 when only the switch 3314 is turned ON is expressed by an expression (5).

$$VA4=V4 \qquad (5)$$

Next, the A4 output voltage VA4 when only the switch 3313 is turned ON is expressed by an expression (6).

$$VA4=R4(V3+V4)/(R3+R4)=(V3+V4)/2 \qquad (6)$$

Next, the A4 output voltage VA4 when only the switch 3312 is turned ON is expressed by an expression (7).

$$VA4=R4(V2+V3+V4)/(R2+R3+R4)=(V2+V3+V4)13 \qquad (7)$$

Next, the A4 output voltage VA4 when only the switch 3311 is turned ON is expressed by an expression (8).

$$VA4=R4(Vi+V2+V3+V4)/(R1+R2+R3+R4)$$
$$(Vi+V2+V3+V4)/4 \qquad (8)$$

From the above expression (8), the divided battery voltage monitor circuit 4 shown in FIG. 5 is regarded as outputting the mean value of the battery voltages, in other words, the divided battery voltage monitor circuit 4 is a mean battery voltage monitor circuit. At this time, the voltage follower circuit 34 may fulfill the withstanding voltage corresponding to about one secondary battery. For example, when the voltage of one secondary battery is 4.5 V at maximum, a fabrication process for an 18 V withstanding voltage is required for the conventional battery voltage monitor amplifier 34A, whereas a fabrication process for only a 4.5 V withstanding voltage may be required for the voltage follower circuit 34 of the present invention. As a result, in accordance with the present invention, the circuit can be made small.

In accordance with the present invention, by employing the divided battery voltage monitor circuit 4 as described above, since the circuit configuration is greatly simplified and becomes small, the manufacturing cost can be reduced and the battery state monitoring circuit and the battery pack can be provided at a low cost.

On the other hand, even when the battery performance and the control circuit performance are both enhanced so that the dispersion in the battery voltages becomes small and hence there is no necessity of being aware of each of the battery voltages, the present invention can be readily applied. For example, if the application is sufficient by only being simply controlled with only the mean battery voltage, then the calculation processing method of the microcomputer 6 may be changed in such a way as to use only the expression (8) of the present invention.

Even if the microcomputer 6 is integrated with other circuit blocks (integral one-chip) so that it is difficult to discriminate the microcomputer 6 from the other circuit blocks, the present invention may be applied thereto with the function of monitoring the battery voltages, the charging current and the discharging current of the secondary batteries and the function of calculating the remaining power of the secondary batteries on the basis of that information regarded as the microcomputer.

Figure 7:
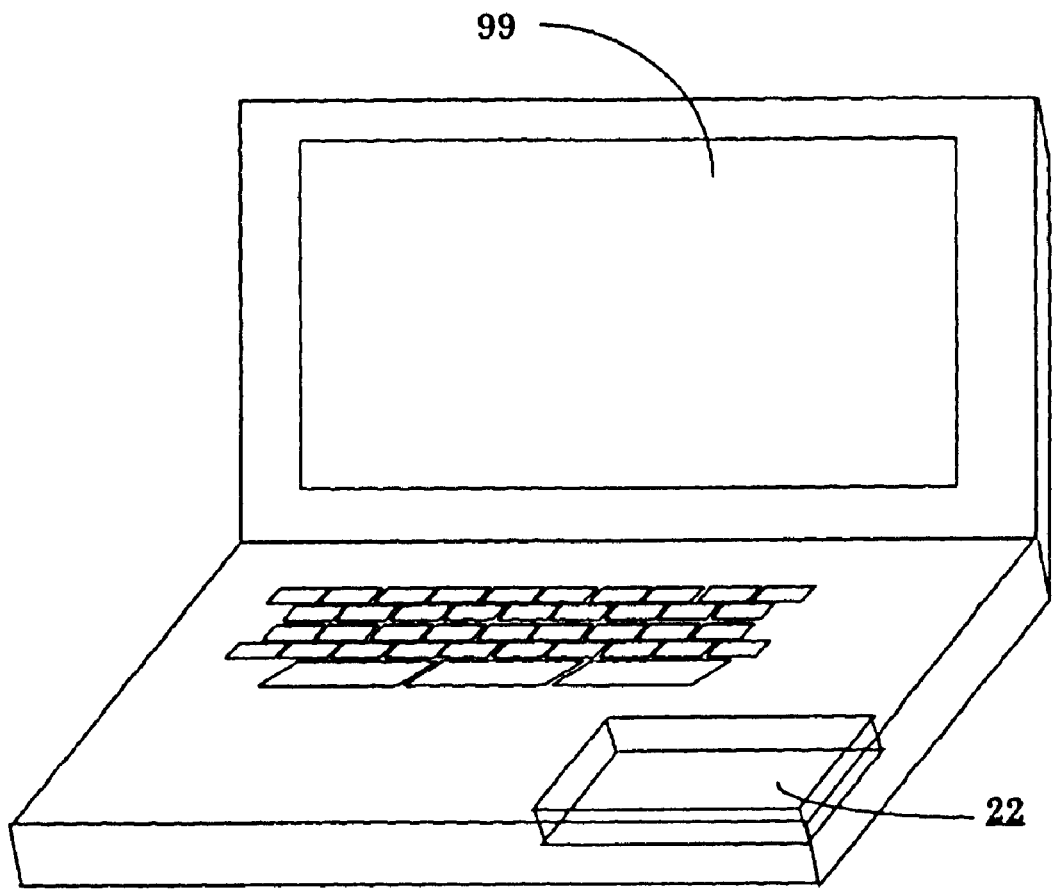
FIG. 7 is a schematic view showing the construction of another embodiment of the present invention.

FIG. 7 shows another embodiment of the present invention. In FIG. 7, a battery apparatus 22 is incorporated as the power source in a notebook type personal computer as the electronic apparatus. The battery apparatus 22 has the battery state monitoring circuit 14 incorporated therein.

For the lithium ion secondary battery which is mounted in current notebook type personal computers, risks such as fire and the explosion due to the high reactivity of lithium are known. That is, the safety of the notebook type personal computer depends greatly on the safety of the battery apparatus. If the safety of the notebook type personal computer is to be enhanced, then it is essential to enhance the safety of both of the battery state monitoring circuit and the battery apparatus. On the other hand, it is intensely desired to provide safely the battery apparatus at a low cost along with the intensification of the cost-down competition in recent years. Now, since the battery state monitoring circuit and the battery apparatus of the present invention can be inexpensively manufactured as described above, the battery state monitoring circuit and the battery apparatus are most suitable for the batteries of the notebook type personal computer. Therefore, the present invention is also applied to the notebook type personal computer having the battery apparatus incorporated therein.

In addition, since the present invention is excellent in respect that the selection range of the microcomputer is wide, a part of the function of calculating the remaining power of the secondary batteries can be carried out by the microcomputer of the notebook type personal computer. From this respect as well, it is understood that the battery apparatus of the present invention and the electronic apparatus having that battery apparatus incorporated therein have the strong connection, and hence the application range of the present invention is wide.

It is to be understood that the notebook type personal computer shown in FIG. 7 is merely one example, and hence the present invention can also be applied, by the same reason, to any of the electronic apparatuses other than the notebook type personal computer.

As set forth hereinabove, a battery state monitoring circuit and a battery apparatus according to the present invention adopts the battery voltage monitor method wherein a divided battery voltage monitor circuit is provided which is capable of dividing the total voltage of a plurality of secondary batteries connected in series with one another and the voltage of each of the connections into arbitrary voltage values, respectively, to output the resultant voltage values, and the battery voltage is calculated on the basis of the combinations of the divided battery voltage values using a microcomputer as one constituent element of the battery state monitoring circuit. Therefore, the circuit configuration is simplified and the circuit becomes small, and also it becomes possible to inexpensively provide the battery state monitoring circuit and the battery pack.

While the present invention has been particularly shown and described with reference to the preferred embodiments, it will be understood that the various changes and modifications will occur to those skilled in the art without departing from the scope and true spirit of the invention. The scope of the invention is therefore to be determined solely by the appended claims.

What is claimed is:

1. In a battery state monitoring circuit having a control circuit for controlling current limiting means to adjust a current of a plurality of series-connected secondary batteries each being chargeable and dischargeable and calculating at least a voltage of the secondary batteries: a battery voltage monitor circuit for monitoring a voltage of the secondary batteries comprising a voltage divider circuit having a plurality of resistors for dividing a total voltage of the plurality of series-connected secondary batteries into a plurality of divided voltages corresponding to each of the batteries; an output terminal for outputting the divided voltages to the control circuit; and a plurality of switches for selectively connecting respective ones of the secondary batteries and the resistors to the output terminal; wherein the control circuit controls the switches sequentially to individually measure a divided voltage and calculates a voltage of each of the secondary batteries based on a measured divided voltage and resistance values of the resistors so that the voltage of each of the secondary batteries may be individually calculated.

2. A battery state monitoring circuit according to claim 1; wherein the values of the resistors of the voltage divider circuit are set so that the divided output voltages the divided battery voltage monitor circuit equals the mean battery voltage value of selected batteries.

3. A battery apparatus comprising: a plurality of rechargeable secondary batteries; current limiting means for adjusting a current of the secondary batteries; a battery state monitoring circuit for controlling the current limiting means and calculating at least a voltage of the secondary batteries; and external connection terminals comprising a positive external connection terminal and a negative external connection terminal for connecting the batteries to an external device; wherein the battery state monitoring circuit comprises the battery state monitoring circuit according to claim 1.

4. A battery apparatus comprising: a plurality of rechargeable secondary batteries; current limiting means for adjusting a current of the secondary batteries; a battery state monitoring circuit for controlling the current limiting means and monitoring at least a voltage of the secondary batteries; and external connection terminals comprising a positive external connection terminal and a negative external connection terminal; wherein the battery state monitoring circuit comprises the battery state monitoring circuit according to claim 2.

5. A battery powered electronic apparatus having a rechargeable battery pack; wherein the rechargeable battery pack comprises the battery apparatus according to claim 3.

6. A battery powered electronic apparatus having a rechargeable battery pack; wherein the rechargeable battery pack comprises the battery apparatus according to claim 4.

7. A rechargeable battery pack comprising: a plurality of series-connected rechargeable batteries; external connection terminals connectable to a charger for charging the batteries and to a load driven by the batteries; one or more switching elements for selectively disconnecting the batteries from the external connection terminals; a battery state monitoring circuit for monitoring a voltage of the batteries; and a control circuit for receiving an output of the battery state monitoring circuit, calculating the voltage of the respective batteries, and controlling the switch elements to disconnect the battery from the external connection terminals when the batteries are in one of an overcharged state and an overdischarged state; wherein the battery state monitoring circuit comprises a voltage divider circuit comprising a plurality of series-connected resistors for dividing a total voltage of the plurality of batteries into a plurality of divided voltages corresponding to each of the batteries, an output terminal for supplying the divided voltages to the control circuit, and a plurality of switches for selectively connecting respective ones of the batteries and the resistors to the output terminal; and wherein the control circuit controls the switches sequentially to individually measure a divided voltage and calculates a voltage of each of the batteries based on a measured divided voltage and the resistance values of the resistors.

8. A rechargeable battery pack according to claim 7; wherein the plurality of resistors and switches of the voltage dividing circuit are arranged so that a resistor and a switch are connected in parallel to each of the batteries.

9. A rechargeable battery pack according to claim 8; wherein the resistance values of the resistors are equal to each other so that an output of the voltage dividing circuit is a mean voltage value of batteries selected by the switches of the voltage dividing circuit.

10. A battery device comprising: current limiting means for limiting a current flowing in rechargeable series-connected batteries; a control circuit for controlling the current limiting means to adjust the current flowing in the plurality of batteries and calculating at least a voltage of the batteries; and a voltage divider circuit for monitoring individual voltages of the batteries comprising a plurality of series-connected resistors for dividing a total voltage of the plurality of batteries into a plurality of divided voltages corresponding to each of the batteries, an output terminal for supplying the divided voltages to the control circuit, and a plurality of switches for selectively connecting respective ones of the batteries and the resistors to the output terminal; wherein the control circuit controls the switches sequentially to individually measure a divided voltage and calculates a voltage of each of the batteries based on the measured divided voltage and the resistance values.

11. A battery device according to claim 10; further comprising external connection terminals comprising a positive external connection terminal and a negative external connection terminal for connecting the batteries to an external device.

12. A battery device according to claim 10; wherein the values of the resistors of the voltage divider circuit are set so that the divided output voltages the divided battery voltage monitor circuit equal the mean battery voltage value of selected batteries.

\* \* \* \* \*